United States Patent
Nakamura

(10) Patent No.: US 6,870,240 B2
(45) Date of Patent: Mar. 22, 2005

(54) ANTI-FUSE AND METHOD FOR WRITING INFORMATION INTO THE ANTI-FUSE

(75) Inventor: Shunji Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/347,692

(22) Filed: Jan. 22, 2003

(65) Prior Publication Data

US 2003/0160298 A1 Aug. 28, 2003

(30) Foreign Application Priority Data

Feb. 26, 2002 (JP) ........................................ 2002-049423

(51) Int. Cl.[7] .............................................. H01L 29/00
(52) U.S. Cl. ...................................... 257/530; 257/50
(58) Field of Search ................................... 257/50, 530

(56) References Cited

U.S. PATENT DOCUMENTS

| | | | | |
|---|---|---|---|---|
| 4,814,853 A | * | 3/1989 | Uchida | 257/530 |
| 5,714,795 A | * | 2/1998 | Ohmi et al. | 257/530 |
| 6,498,056 B1 | * | 12/2002 | Motsiff et al. | 438/131 |
| 6,549,447 B1 | * | 4/2003 | Fricke et al. | 365/105 |
| 2003/0052320 A1 | * | 3/2003 | Tran et al. | 257/50 |

FOREIGN PATENT DOCUMENTS

JP 11-97535 4/1999

OTHER PUBLICATIONS

Hiroshi Horie et al., *Novel High Aspect Ratio Aluminum Plug for Logic/DRAM LSIs Using Polysilicon–Aluminum Substitute (PAS)*, International Electron Device Meeting 96; pp. 946–948 (1996).

S. Nakamura et al.; *Aluminum Word Line and Bit Line Fabrication Technology for COB DRAM Using a Polysilicon–Aluminum Substitute*, 1999 Symposium on VLSI Technology Digest of Technical Papers, 4A–2, pp. 35–36, (1999).

* cited by examiner

Primary Examiner—Allan R. Wilson
(74) Attorney, Agent, or Firm—Westerman, Hattori, Daniels & Adrian, LLP

(57) ABSTRACT

The anti-fuse comprises a substitutable layer 14, an interconnection layer 20 connected to the substitutable layer, and the interconnection layer contains metal atoms which can be substituted with constituent atoms of the substitutable layer. The anti-fuse can be changed from the non-conduction state to the conduction state at a relatively low temperature of 300° C. to 600° C., and by application of not so intense laser beams, the anti-fuse can be changed from the non-conduction state to the conduction state. The anti-fuse can be changed from the non-conduction state to the conduction state by using an inexpensive equipment, which can realize decrease of fabrication costs and accordingly inexpensive semiconductor devices can be provided.

21 Claims, 14 Drawing Sheets

ANTI-FUSE AND METHOD FOR WRITING INFORMATION INTO THE ANTI-FUSE

CROSS-REFERENCE TO RELATED APPLICATION

This application is based upon and claims priority of Japanese Patent Application No.2002-49423, filed on Feb. 26, 2002, the contents being incorporated herein by reference.

BACKGROUND OF THE INVENTION

The present invention relates to an anti-fuse and a method for writing information into the anti-fuse, more specifically to an anti-fuse and a method for writing information into the anti-fuse which can realize low costs and micronization of semiconductor devices, etc.

A number of elements are integrated on a semiconductor chips, but all the elements do not always normally function. Methods for replacing defective elements by normal elements to improve yields are proposed.

To replace a defective element by a normal element, the circuit must be switched. Fuses are proposed as means for switching circuits.

The proposed semiconductor device will be explained with reference to FIGS. 14A and 14B. FIGS. 14A and 14B are sectional views of the proposed semiconductor device.

As shown in FIG. 14A, an insulation film 112 of $SiO_2$ is formed on a semiconductor substrate 110 of silicon. An interconnection layer 114 of, e.g., Al is formed on the insulation film 112. An insulation film 116 is formed on the insulation film 112 with the interconnection layer 114 formed on. Openings 118 are formed in the insulation film 116 down to the interconnection layer 114. An interconnection layer 120 of Al is laid on the insulation film 116 with the openings 118 formed in with a barrier layer 119 of TiN or WN formed therebetween. The interconnection layer 120 is formed on both sides of the interconnection layer 114. Thus, a fuse 123 including the interconnection layers 114 is formed.

Inter-layer insulation films 124a to 124d and interconnection layers 126a to 126d are formed on the interconnection layer 120. An opening 140 is formed in the inter-layer insulation films 124a to 124d down to the interconnection layer 114.

Thus, the proposed semiconductor device is constituted.

The fuse 123 of such semiconductor device can be changed from the conduction state to the non-conduction state by the following way.

As shown in FIG. 14A, in the state that the interconnection layer 114 is not broken, the fuse 123 is in the conduction state.

As shown in FIG. 14B, an intense laser beam is applied to the interconnection layer 114 from above. When the intense laser beam is applied to the interconnection layer 114, a part of the interconnection layer 114 is melted and evaporated, and the interconnection layer 114 is broken. Thus, the fuse 123 is changed from the conduction state to the non-conduction state. A defective element is thus replaced by a normal element, and yields of the semiconductor device can be increased.

However, in the proposed semiconductor device shown in FIGS. 14A and 14B, in order to change the conduction state, a part of the interconnection layer 114 must be melted and scattered. Intense laser beams must be applied to the interconnection layer 114. In the proposed semiconductor device, unless an expensive equipment which can generate intense laser beams is used, the conduction state of the fuse cannot be changed.

In the proposed semiconductor device, in which the above-describe intense laser beams must be applied, neighboring fuses 123 must be considerably spaced from one another in order to prevent other neighboring fuses 123 which are not to be changed to the non-conduction state from being changed to the non-conduction state. Accordingly, in the proposed semiconductor device, fuses cannot arranged in high density, which makes a region for a plurality of fuses 123 to be arranged considerably large.

In the proposed semiconductor device, in order to change the fuse 123 from the conduction state to the non-conduction state by melting and evaporating a part of the interconnection layer 114, the opening 140 must be formed down to the interconnection layer 114 so that the melted metal can be evaporated. Accordingly, the step of forming the opening 140 is necessary.

In the proposed semiconductor device, it is not easy to form in the inter-layer insulation films 124a to 124d the opening 140 deep down to the lower layer. Accordingly, the proposed semiconductor device has low freedom of design.

In the proposed semiconductor device, in many cases, the fuse 123 is formed near the upper layer, which often makes a width of the interconnection layer 114 large. This is because usually micronization processing is not used near the upper layer. In the proposed semiconductor device, without melting and evaporating the wide interconnection layer 114, the fuse 123 cannot be changed from the conduction state to the non-conduction state. Accordingly, in the proposed semiconductor device, an intensity of laser beams to be applied must be set high, and a time of applying laser beams must be set considerably long.

The use of anti-fuses makes redundancy circuits simple than the use of the fuses 123. The development of the anti-fuse is awaited.

SUMMARY OF THE INVENTION

An object of the present invention is to provide an anti-fuse and a method for writing information into the anti-fuse which can realize low costs and micronization of semiconductor devices, etc.

According to one aspect of the present invention, there is provided an anti-fuse comprising: a substitutable layer; and an interconnection layer connected to the substitutable layer, the interconnection layer containing metal atoms which can be substituted with constituent atoms of the substitutable layer.

According to another aspect of the present invention, there is provided a method for writing information into an anti-fuse comprising a substitutable layer and an interconnection layer connected to the substitutable layer, the interconnection layer contains metal atoms which can be substituted with constituent atoms of the substitutable layer; and the metal atoms of the interconnection layer being substituted with the constituent atoms of the substitutable layer to thereby change the anti-fuse from the non-conduction state to the conduction state.

As described above, according to the present embodiment, the anti-fuse can be changed from the non-conduction state to the conduction state at a relatively low temperature of 300° C. to 600° C., and by application of not so intense laser beams, the anti-fuse can be changed from the non-conduction state to the conduction state. According to the present invention, the anti-fuse can be changed from the non-conduction state to the conduction state by using an inexpensive equipment, which can realize decrease of fabrication costs and accordingly inexpensive semiconductor devices can be provided.

According to the present invention, even with not so intense laser beams, the anti-fuse can be changed from the non-conduction state to the conduction state, whereby even when a plurality of anti-fuses are arranged adjacent to each other, adjacent ones of the anti-fuses which are not to be changed to the conduction state are never changed to the conduction state. Thus, according to the present invention, a plurality of the anti-fuses can be arranged in high density, which permits a region for the anti-fuses to be arranged in to be small, and a chip size can be accordingly small. According to the present invention, inexpensive semiconductor devices can be provided.

According to the present invention, the substitutable layer is substituted with aluminum, whereby the anti-fuse can be changed from the non-conduction sate to the conduction state, which makes the opening for the melted material to evaporate through unnecessary. According to the present invention, it is not necessary to form the opening which reaches the substitutable layer in the inter-layer insulation films, which simplifies the steps.

According to the present invention, it is not necessary to form the opening down to the substitutable layer, which allows the anti-fuse to be formed in a lower part. According to the present invention, the anti-fuse can be formed in a lower part, which improves freedom of designing semiconductor devices.

According to the present invention, the anti-fuse can be formed in a lower part, which permits the micronization process. For example, when micronized gate electrodes of polysilicon are formed, the substitutable layer can be micronized. According to the present invention, the substitutable layer can be micronized, and the anti-fuse can be changed from the non-conduction state to the conduction state without applying not so intense laser beams. According to the present invention, the substitutable layer can be micronized, whereby even when an application time of laser beams is set short, the anti-fuse can be changed from the non-conduction state to the conduction state. Accordingly, according to the present invention, high throughputs can be attained.

According to the present invention, the presence of the anti-fuse can make redundant circuits simple, which can contribute to downsizing of semiconductor chips. Thus, according to the present invention, inexpensive semiconductor devices can be provided.

According to the present invention, the conductor plugs and the conductor layer for conducting heat from the surface of the inter-layer insulation film to the substitutable laser and the interconnection layer are buried in the inter-layer insulation films, whereby even with relatively weak laser beams, the substitutable layer can be substituted by aluminum. Thus, according to the present invention, the anti-fuse can be changed from the non-conduction state to the conduction state by using an inexpensive equipment.

According to the present invention, the current supply circuit for supplying current to the substitutable layer and the interconnection layer is provided, whereby without applying laser beams, the substitutable layer and the interconnection layer can be heated. Thus, according to the present invention, without applying laser beams, the anti-fuse can be changed from the non-conduction state to the conduction state.

According to the present invention, the anti-fuse can be changed from the non-conduction state to the conduction state also by supplying current to the substitutable layer and the interconnection layer and also by applying laser beams directly to the substitutable layer. Thus, according to the present invention, before semiconductor chips are sealed in packages, the anti-fuse can be changed from the non-conduction state to the conduction state by applying laser beams, and after the semiconductor chips have been sealed in packages, the anti-fuse can be changed from the non-conduction state to the conduction state by causing the substitutable layer to heat by itself with the use of the current supply circuit. That is, according to the present invention, before semiconductor chips are sealed in packages, the anti-fuse is used as a laser anti-fuse, and the anti-fuse is used as an electronic anti-fuse after the semiconductor chips have been sealed in the packages. According to the present invention, the anti-fuse can be used not only as a laser anti-fuse but also as an electronic anti-fuse, whereby it is not necessary to respectively form the laser anti-fuse and the electronic anti-fuse. Thus, according to the present invention, simple structures and simple fabrication processes can be realized.

According to the present invention, the heating means for heating the substitutable layer is near the substitutable layer, whereby the substitutable layer and the interconnection layer is heated by the heating means to thereby substitute the substitutable layer by aluminum.

According to the present invention, the anti-fuse is changed from the non-conduction state to the conduction state and then from the conduction state to the non-conduction state, whereby the anti-fuse can be used as a fuse. According to the present invention, the anti-fuse can be changed from the non-conduction state to the conduction state and then from the conduction state to the non-conduction state, whereby the anti-fuse which has been erroneously changed to the conduction state can be returned to the non-conduction state.

DETAILED DESCRIPTION OF THE INVENTION

A First Embodiment

Figure 1:
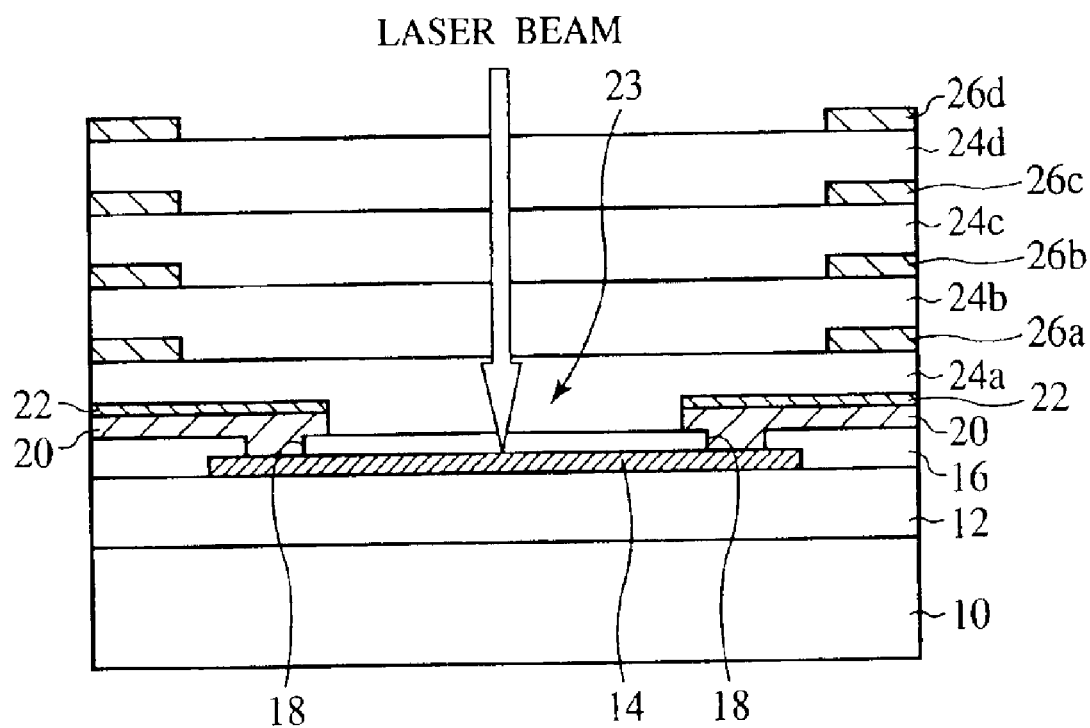
FIG. 1 is a sectional view of the semiconductor device according to a first embodiment of the present invention.

A semiconductor device according to a first embodiment of the present invention and a method for fabricating the semiconductor device, and the method of writing information into the anti-fuse will be explained with reference to FIGS. 1 to 3C. FIG. 1 is a sectional view of the semiconductor device according to the present embodiment. FIGS. 2A to 3C are sectional views of the semiconductor device in the steps of the method for fabricating the same, which explain the method.

The present embodiment will be explained by means of the semiconductor device using the anti-fuses. The anti-fuse according to the present embodiment is not essentially mounted on semiconductor devices and can be mounted on any electronic device. The present invention is applicable to a single anti-fuse.

(Semiconductor Device)

The semiconductor device according to the present embodiment will be explained with reference to FIG. 1.

As shown in FIG. 1, an insulation film of, e.g., a 200 nm-thickness $SiO_2$ film is formed on a semiconductor substrate 10 of silicon.

A substitutable layer 14 of a 5 to 200 nm-thickness polysilicon is formed on the insulation film 12. A length of the substitutable layer 14 is set to be, e.g., 1 μm, and a width of the substitutable layer 14 is, e.g., 0.2 μm. The substitutable layer 14 has high resistance of, e.g., 10 kΩ–1MΩ. The substitutable layer means a layer whose constituent atoms can be substituted with metal atoms. The substitutable layer can be substituted with metal by high-temperature thermal processing or others.

An insulation film 16 of, e.g., a 200 nm-thickness $SiO_2$ film is formed on the insulation film 12 with the substitutable layer 14 formed on.

Openings 18 are formed in the insulation film 16 down to the substitutable layer 14.

Interconnection layers 20 of a 100 to 500 nm-thickness Al film are formed on the insulation film 16 with the openings 18 formed in. The interconnection layers 20 are connected to both sides of the substitutable layer 14.

In the present embodiment, no barrier layer is formed below the interconnection layer 20. No barrier layer is formed between the interconnection layers 20 and the substitutable layer 14 in the present embodiment, because when the barrier layer is formed between the interconnection layer 20 and the substitutable layer 14, silicon in the substitutable layer 14 and aluminum in the substitutable layer 20 cannot be mutually diffused, and the substitutable layer 14 of polysilicon cannot be substituted with aluminum.

Thus, an anti-fuse 23 including the substitutable layer 14 of polysilicon is formed.

An absorptive layer 22 of a 100 to 200 nm-thickness Ti film is formed on the interconnection layer 20. The absorptive layer 22 absorbs silicon mutually diffused in the interconnection layer 20 when the substitutable layer 14 of polysilicon is substituted with aluminum by polysilicon-aluminum substitution. Silicon mutually diffused in the interconnection layer 20 can be absorbed by the absorptive layer 22, whereby even when the interconnection layer 20 is formed thin or micronized, the substitutable layer 14 of polysilicon can be substituted with aluminum without failure.

Here, the polysilicon-aluminum substitution means that a substitutable layer formed of polysilicon, etc. is contacted to a metal layer formed of aluminum, etc. to substitute the substitutable layer of polysilicon, etc. with the metal, such as aluminum, etc. by thermal processing. About the polysilicon-aluminum substitution, refer to the specification of Japanese Patent Laid-Open Publication No. Hei 11-97535/1999. The polysilicon-aluminum substitution is described also in International Electron Devices Meeting 96, p. 946–948. The polysilicon-aluminum substitution is published in a VSLI symposium, June, 1999 (refer to 1999 Symposium on VLSI Technology 4A-2, p. 35–36).

An inter-layer insulation film 24a of, e.g., a 500 nm to 1 μm-thickness $SiO_2$ film is formed on the insulation film 16 with the interconnection layer 20 formed on.

An interconnection layer 26a of Al is formed on the inter-layer insulation film 24a.

An inter-layer insulation film 24b of, e.g., a 500 nm to 1 μm-thickness $SiO_2$ film is formed on the inter-layer insulation film 24a with the interconnection layer 26a formed on.

An interconnection layer 26b of Al is formed on the inter-layer insulation film 24b.

An inter-layer insulation film 24c of, e.g., a 500 nm to 1 μm-thickness $SiO_2$ film is formed on the inter-layer insulation film 24b with the interconnection layer 26b formed on.

An interconnection layer 26c of Al is formed on the inter-layer insulation film 26c.

An inter-layer insulation film 24d of, e.g., a 500 nm to 1 μm-thickness $SiO_2$ film is formed on the inter-layer insulation film 24c with the interconnection layer 26c formed on.

An interconnection layer 26d of Al is formed on the inter-layer insulation film 24d.

Thus, the semiconductor device according to the present embodiment is constituted.

Next, the method for writing information into the anti-fuse according to the present embodiment will be explained.

In this specification, the method for writing information into the anti-fuse means a method for changing the conduction state of the anti-fuse based on the information, more specifically changing the anti-fuse from the non-conduction state to the conduction state or returning the anti-fuse from the conduction state to the non-conduction state. The method for returning the anti-fuse from the conduction state to the non-conduction state will be described later.

The substitutable layer 14 of polysilicon is very highly resistive. With the substitutable layer 14 of polysilicon not substituted with aluminum, e.g., with the substitutable layer 14 not changed to the metal substituted layer, the anti-fuse 23 is in the non-conduction state.

In this specification, the substituted metal layer means a metal layer obtained by substituting the substitutable layer with metal.

When an anti-fuse is made conductive, laser beams are applied to the substitutable layer 14 from above the semiconductor substrate 10. At this time, an intensity of the laser beams are suitably set so that a temperature of the substitutable layer 14 is, e.g., 300 to 600° C., whereby silicon in the substitutable layer 14 and aluminum in the interconnection layer 20 are mutually diffused to substitute the substitutable layer 14 of polysilicon with aluminum. That is, by the polysilicon-aluminum substitution, the substitutable layer 14 of polysilicon is substituted by aluminum. When the substitutable layer 14 has an about 1 $\mu$m-length and an about 0.2 $\mu$m-width, and a heating temperature is about 425° C., the substitutable layer 14 of polysilicon can be substituted with aluminum in only about 3 minutes. The substitutable layer 14 which has become the metal substituted layer has a very low electric resistance, and the anti-fuse has the conduction state.

In the present embodiment, damages which are marks of the application of laser beams often remain.

In the present embodiment, silicon in the substitutable layer 14 and aluminum in the interconnection layer 20 are mutually diffused, whereby the substitutable layer 14 of polysilicon is substituted with aluminum, and the substitutable layer 14 and the interconnection layer 20 become integral with each other.

In the present embodiment, silicon in the substitutable layer 14 and aluminum in the interconnection layer 20 are mutually diffused, whereby the substitutable layer 14 of polysilicon is substituted with aluminum, and concentration inclinations of silicon which is a semiconductor forming atom substituted with aluminum are often present.

Thus, the anti-fuse is changed from the non-conduction state to the conduction state to replace defective elements by normal elements, whereby yields of the semiconductor device can be high.

The semiconductor device according to the present embodiment is characterized mainly in that the anti-fuse 23 includes the substitutable layer 14 of polysilicon, and the substitutable layer 14 of polysilicon is substituted with aluminum, whereby the anti-fuse 23 can be changed from the non-conduction state to the conduction state.

Figure 14A:
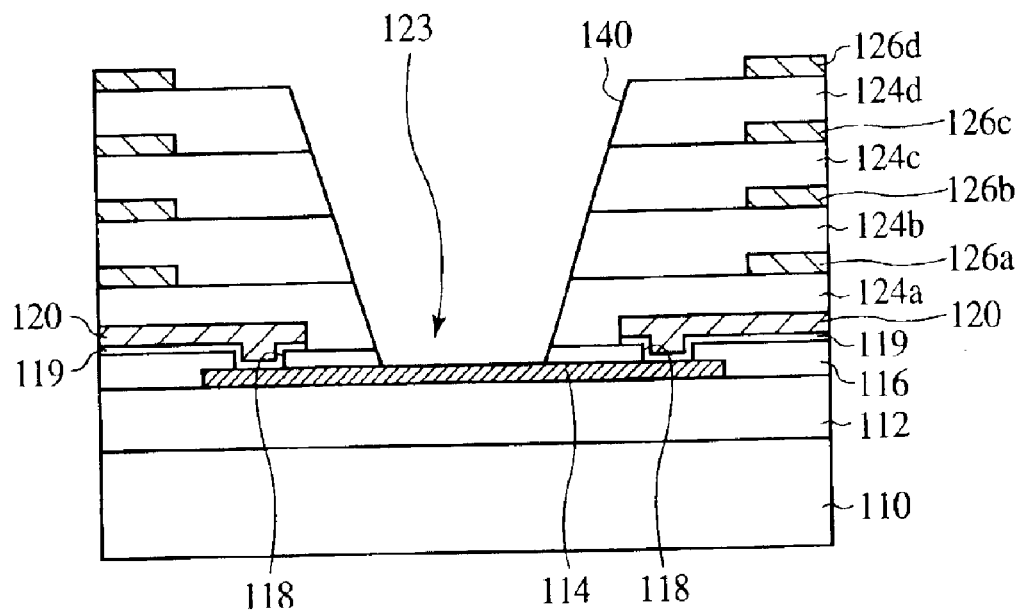
FIGS. 14A and 14B are sectional view of the proposed semiconductor device.
Figure 14B:
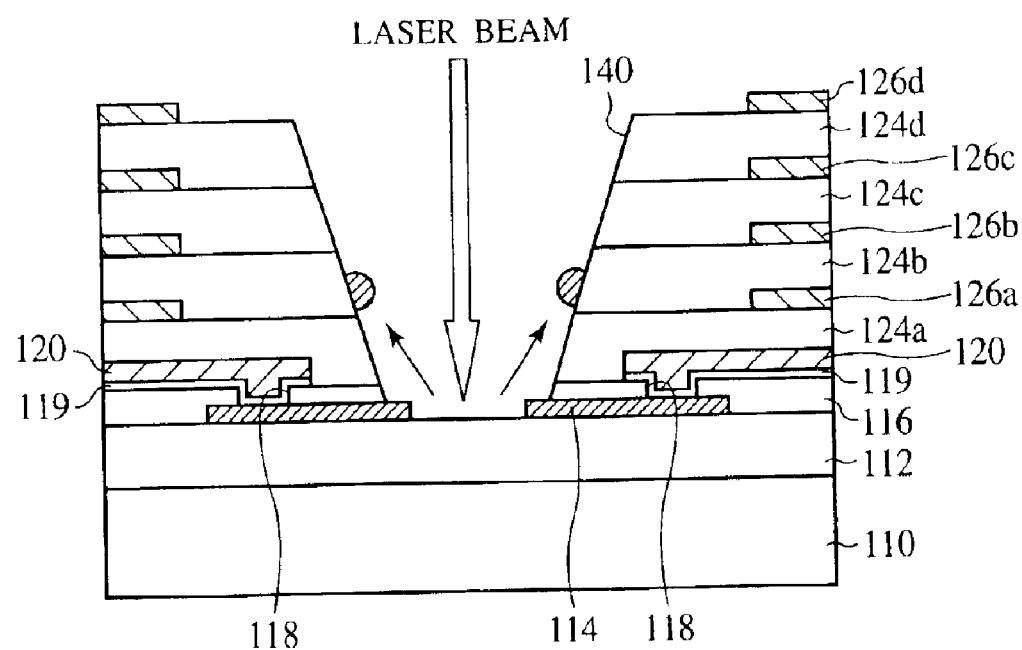

In the proposed semiconductor device shown in FIGS. 14A and 14B, in order to change the fuse 123 to the conduction state, the interconnection layer 114 must melted and scattered, and to this end intense laser beams must be applied to the interconnection layer 114. The proposed semiconductor device cannot change the conduction state of the fuse 123 without using an expensive equipment for generating intense laser beams.

In contrast to this, according to the present embodiment, the anti-fuse 23 can be changed to the non-conduction state to the conduction state at relatively low temperatures of 330° C. to 600° C., so that the anti-fuse 23 can be changed from the non-conduction state to the conduction state without applying so intense laser beams. According to the present embodiment, the anti-fuse 23 is changed from the non-conduction state to the conduction state by using an inexpensive equipment, whereby low fabrication costs can be realized, which permits the semiconductor device to be inexpensive.

In the proposed semiconductor device shown in FIGS. 14A and 14B, in which, as described above, intense laser beams must be applied, neighboring fuses 123 must be considerably spaced from each other so as to prevent the conduction state of the neighboring fuses whose conduction states are not to be changed from being changed. Accordingly, in the proposed semiconductor device, the fuses 123 cannot be arranged in high density, and a region required for arranging a plurality of the fuses 123 is considerably large.

In contrast to this, according to the present embodiment, in which, as described above, the anti-fuse 23 can be changed from the non-conduction state to the conduction state even by the use of not so intense laser beams, even when a plurality of the anti-fuses 23 are arranged adjacent to one another, the conduction state of neighboring ones of the anti-fuses 23, whose conduction state is not to be changed is not changed. Accordingly, according to the present embodiment, the anti-fuses 23 can be arranged in high density, which allows a region required for arranging the anti-fuses 23 can be small, and a chip size can be small. Thus, the semiconductor device according to the present embodiment can be more inexpensive.

In the proposed semiconductor device shown in FIGS. 14A and 14B, in which the interconnection layer 114 is partially melted and evaporated to thereby change the fuse 123 from the conduction state to the non-conduction state, the opening 140 must be formed down to the interconnection layer 114 so as to permit the melted substance to be evaporated. To this end, the step of forming the opening 140 is necessary.

In contrast to this, according to the present embodiment, in which the substitutable layer 14 of polysilicon is substituted with aluminum to thereby change the anti-fuse 23 from the non-conduction state to the conduction state, the opening for evaporating the melted substance is unnecessary. According to the present embodiment, it is not necessary to form the opening in the inter-layer insulation films 24a to 24d down to the substitutable layer 14, which can simplify the steps.

In the proposed semiconductor device, in which it is not easy to form the opening 140 in the inter-layer insulation films 124a to 124d deep down to the lower layer, it is difficult to form the fuse 123 in lower layers. Accordingly, the proposed semiconductor device has low freedom of designing the semiconductor device.

In contrast to this, according to the present embodiment, in which it is not necessary to form the opening down to the substitutable layer 14, the anti-fuse 23 can be formed in lower layers. According to the present embodiment, the anti-fuse 23 can be formed in lower layers, which can improve freedom of designing the semiconductor device.

In the proposed semiconductor device, in which the fuse 123 is formed near the upper layers, the interconnection layer 114 has a large width. This is because micronization processing is not applied to the upper layers. Accordingly, in the proposed semiconductor device, the wide interconnection layer 114 must be melted and evaporated, and an intensity of laser beams to be applied must be set to be accordingly high. An application time of laser beams must be set to be considerably long.

In contrast to this, according to the present embodiment, in which the anti-fuse 23 can be formed in the lower layers, micronization processing can be used. For example, when micronized gate electrodes of polysilicon are formed, the micronized substitutable layer 14 can be formed. According to the present embodiment, because of the substitutable layer 14 which can be micronized, the anti-fuse 23 can be changed from the non-conduction state to the conduction state without applying not so intense laser beams. According to the present embodiment, because of the substitutable layer 14 which can be micronized, even when an application time of laser beams is set short, the anti-fuse 23 can be changed from the non-conduction state to the conduction state. Accordingly, the semiconductor device according to the present embodiment can have improved throughputs.

The use of anti-fuses often makes redundancy circuits simpler than the use of fuses. According to the present embodiment, which uses the anti-fuse 23, the redundancy circuit can be made simple, which can contribute to downsizing of semiconductor chips. Thus, the semiconductor device according to the present embodiment can be more inexpensive.

(The Method for Fabricating the Semiconductor Device)

Then, the method for fabricating the semiconductor device according to the present embodiment will be explained with reference to FIGS. 2A to 3C.

Figure 2A:
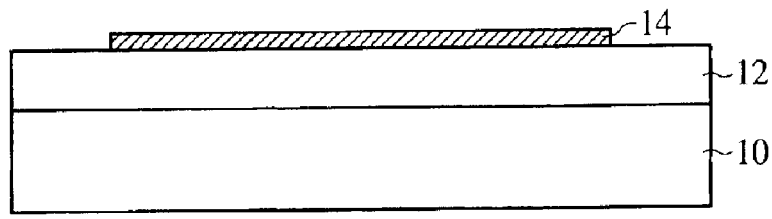
FIGS. 2A to 2D are sectional views of the semiconductor device according to a first embodiment of the present invention in the steps of the method for fabricating the semiconductor device, which explain the method (Part 1).

First, as shown in FIG. 2A, the insulation film 12 of, e.g., a 200 nm-thickness $SiO_2$ film is formed on a semiconductor substrate 10 of silicon by, e.g., CVD (Chemical Vapor Deposition).

Next, a polysilicon layer of, e.g., a 5 to 200 nm-thickness is formed on the entire surface by, e.g., CVD. Then, the polysilicon layer is patterned by photolithography. Thus, the substitutable layer 14 of, e.g., a 1 $\mu$m-length and a 0.2 $\mu$m-width formed of polysilicon is formed.

Figure 2B:
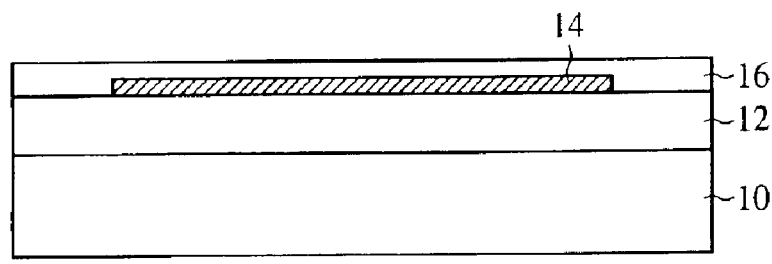

Next, as shown in FIG. 2B, the insulation film 16 of a 200 nm-thickness $SiO_2$ film is formed on the entire surface by, e.g., CVD.

Figure 2C:
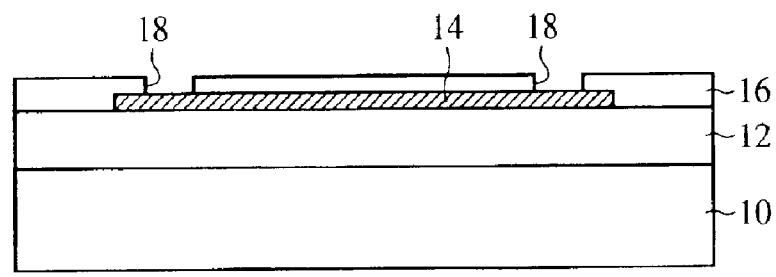

Then, as shown in FIG. 2C, the openings 18 are formed in the insulation film 16 down to the substitutable layer 14 of polysilicon.

Then, an Al layer of, e.g., a 100 to 500 nm-thickness is formed on the entire surface by, e.g., CVD or sputtering.

Next, a Ti layer of, e.g., a 100 to 200 nm-thickness is formed on the entire surface by, e.g., CVD or sputtering.

Figure 2D:
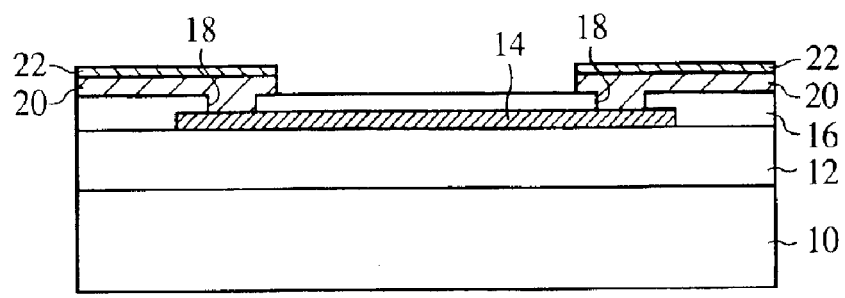

Then, the Ti layer and the Al layer are patterned by photolithography to thereby form, as shown in FIG. 2D, the interconnection layer 20 of Al with an absorption layer 22 of Ti formed on the upper surface.

Figure 3A:
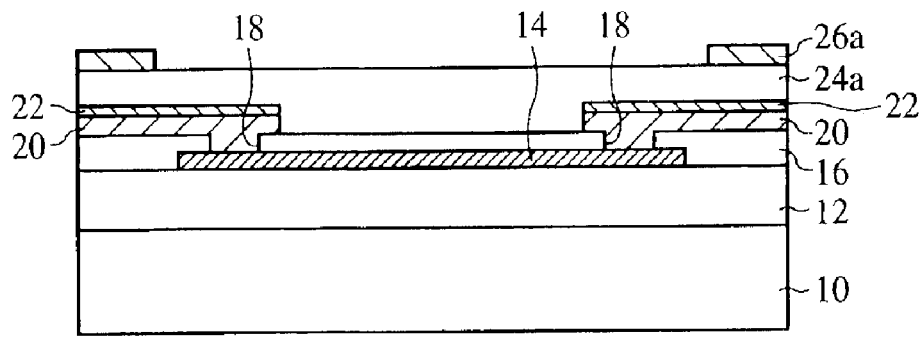
FIGS. 3A to 3C are sectional views of the semiconductor device according to a first embodiment of the present invention in the steps of the method for fabricating the semiconductor device, which explain the method (Part 2).

Next, as shown in FIG. 3A, the inter-layer insulation film 24a of a 500 nm to 1 $\mu$m-thickness $SiO_2$ film is formed on the entire surface by, e.g., CVD.

Then, an Al layer is formed on the entire surface by CVD or sputtering. Then, the Al layer is patterned to thereby form the interconnection layer 26a of Al.

Figure 3B:
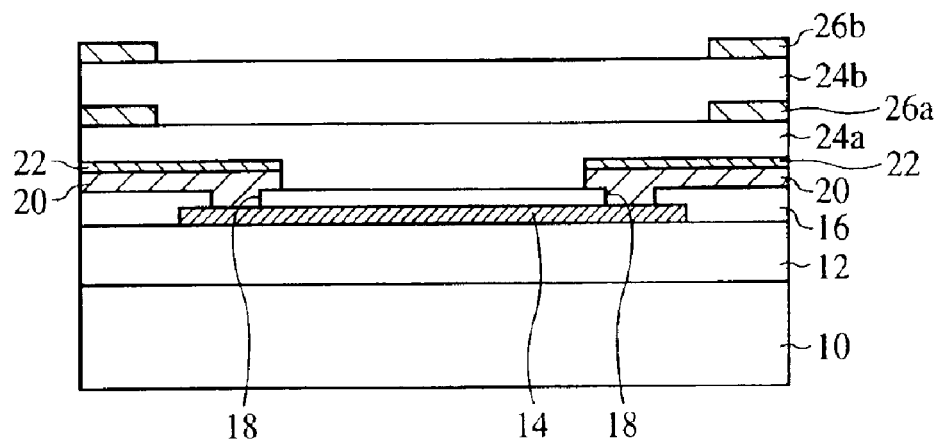

Next, as shown in FIG. 3B, the inter-layer insulation film 24b of a 500 nm to 1 $\mu$m-thickness $SiO_2$ is formed on the entire surface by, e.g., CVD.

Then, an Al layer is formed on the entire surface by CVD or sputtering. Then, the Al layer is patterned by photolithography to thereby form the interconnection layer 26b of Al.

Figure 3C:
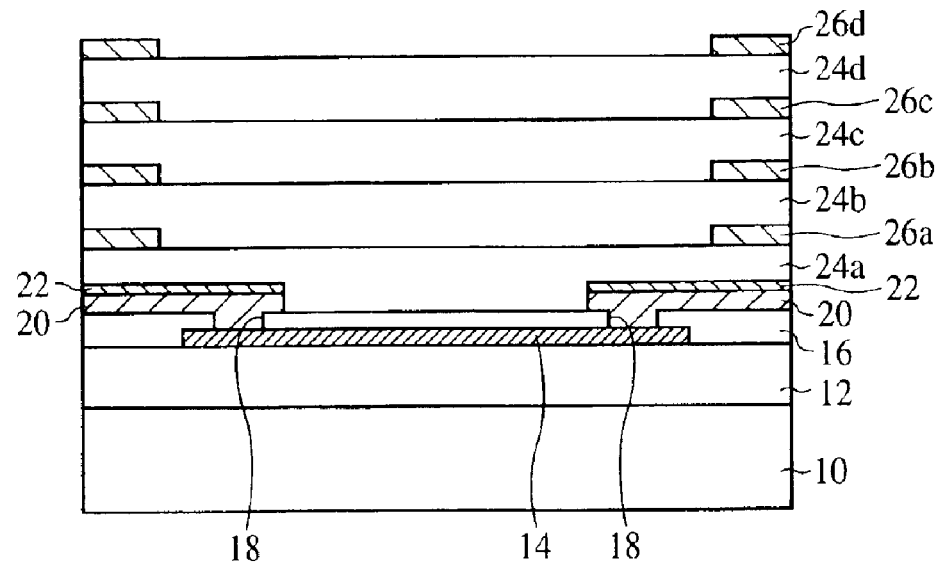

Next, as shown in FIG. 3C, the inter-layer insulation film 24c of a 500 nm to 1 $\mu$m-thickness $SiO_2$ film on the entire surface by, e.g., CVD.

Then, an Al layer is formed on the entire surface by CVD or sputtering. Then, the Al layer is patterned by photolithography to thereby form the interconnection layer 26c of Al.

Next, the inter-layer insulation film 24d of a 0.500 nm to 1 $\mu$m-thickness $SiO_2$ film is formed on the entire surface by CVD.

Then, an Al layer is formed o the entire surface by CVD or sputtering. Then, the Al layer is patterned by photolithography to thereby form the interconnection layer 26d of Al.

Thus, the semiconductor device according to the present embodiment is fabricated.

Thermal processing of, e.g., 300 to 600° C. performed after the interconnection layer 20 has been formed causes a risk that the silicon in the substitutable layer 14 and the aluminum in the interconnection layer 20 may be mutually diffused to thereby substitute the substitutable layer 14 of polysilicon with aluminum. It is preferable that thermal processing of 300 to 600° C. is not performed after the interconnection layer 20 has been formed. However, the thermal processing of 300 to 600° C. may be performed in a short period of time which allows a part of the substitutable layer 14 of polysilicon to remain formed of polysilicon, because unless the substitutable layer 14 of polysilicon is all substituted with aluminum, the anti-fuse 23 is not changed from the non-conduction state to the conduction state.

(Modification)

Figure 4:
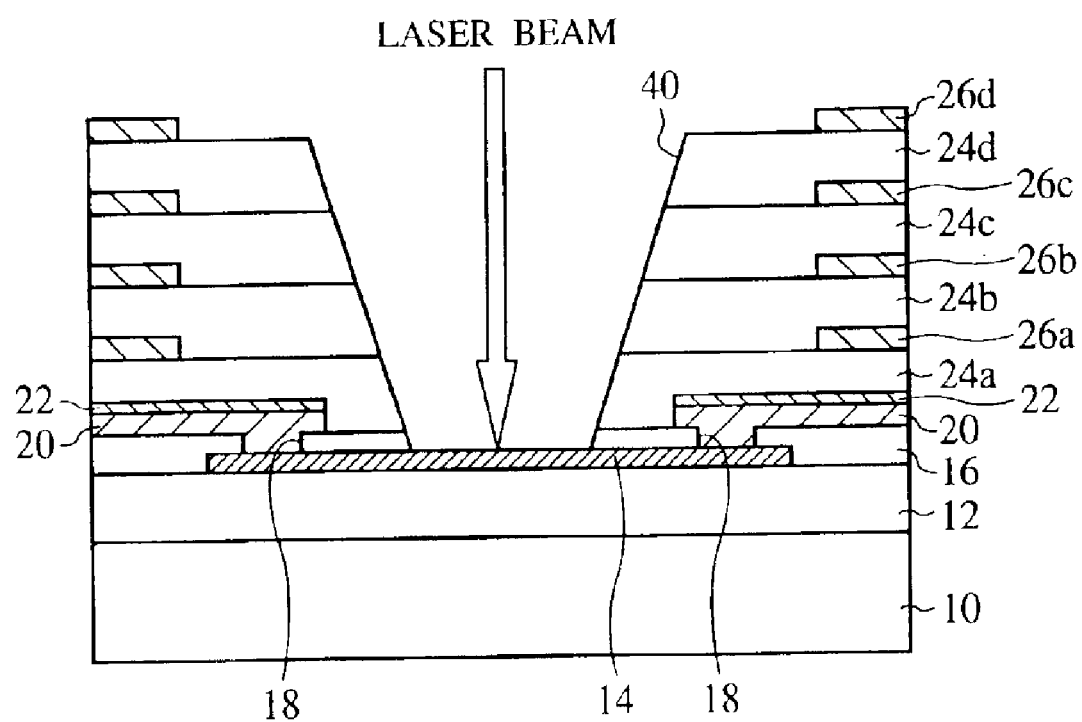
FIG. 4 is a sectional view of a modification of the semiconductor device according to the first embodiment of the present invention.

Next, a modification of the semiconductor device according to the present embodiment will be explained with reference to FIG. 4. FIG. 4 is a sectional view of the semiconductor device according to the present modification.

The semiconductor device according to the present modification is characterized mainly in that an opening 40 is formed in the inter-layer insulation films 24a to 24d and the insulation film 16 down to the substitutable layer 14.

According to the present modification, the opening 40 formed in the inter-layer insulation films 24a to 24d and the insulation film 16 down to the substitutable layer 14 can prevent laser beams from attenuating in the inter-layer insulation films 24a to 24d and the insulation film 16. Accordingly, according to the present modification, even when relatively weak laser beams are applied, the substitutable layer 14 and the interconnection layer 20 can be heated to about 300 to 600° C. to thereby substitute the substitutable layer 14 of polysilicon with aluminum. Thus, according to the present embodiment, even with an inexpensive equipment which cannot apply intense laser beams, the anti-fuse 23 can be changed form the non-conduction state to the conduction state, which can contribute to lower costs.

A Second Embodiment

Figure 5:
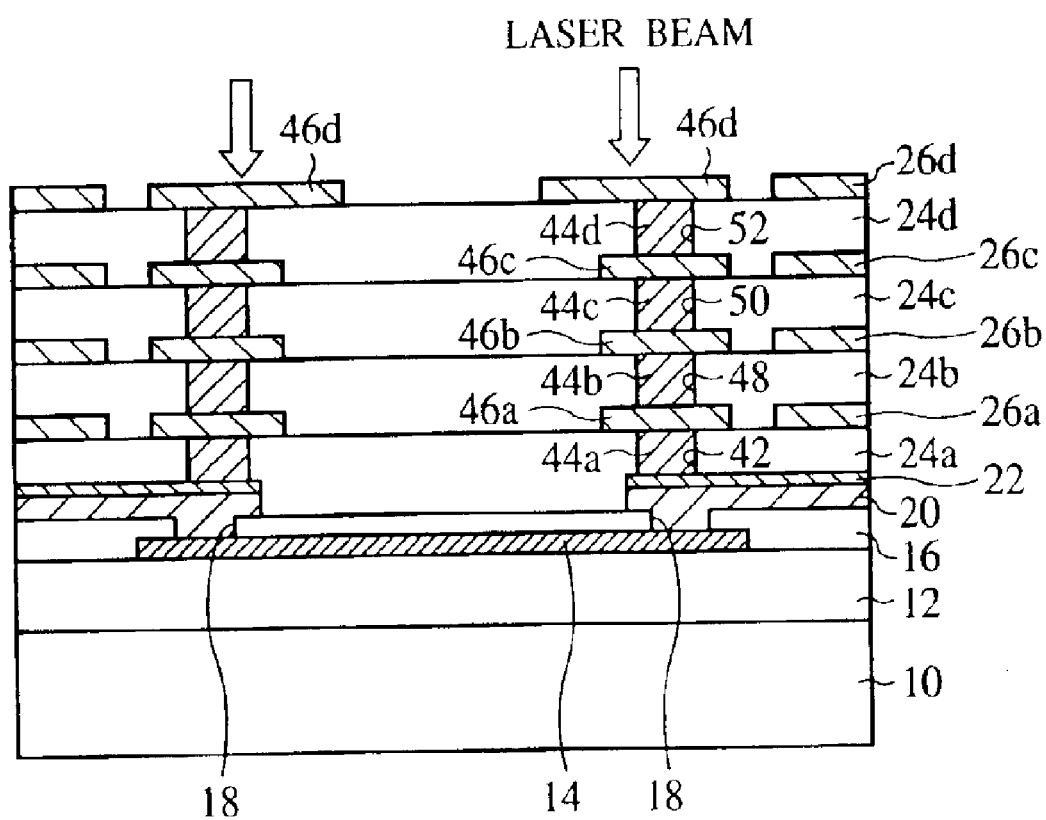
FIG. 5 is a sectional view of the semiconductor device according to a second embodiment of the present invention.

The semiconductor device according to a second embodiment of the present invention and the method for fabricating the semiconductor device, and the method for writing information into the anti-fuse will be explained with reference to FIGS. 5 to 7D. FIG. 5 is a sectional view of the semiconductor device according to the present embodiment. The same members of the present embodiment as those of the semiconductor device according tot he first embodiment and the method for fabricating the same shown in FIGS. 1 to 4 are represented by the same reference numbers not to repeat or to simplify their explanation.

The semiconductor device according to the present embodiment is characterized mainly in that a conductor which conducts heat to a substitutable layer 14 and the interconnection layer 20, specifically conductor layers 46a to 46d and conductor plugs 44a to 44d are buried in inter-layer insulation films 24a to 24d.

As shown in FIG. 5, openings 42 are formed in the inter-layer insulation film 24a down to an absorption layer 22. Conductor plugs 44a of W (tungsten) or Al are buried in the openings 42.

The conductor layer 46a of Al is formed on the inter-layer insulation film 24a with the conductor plugs 44a buried in.

Openings 48 are formed in the inter-layer insulation film 24b down to the conductor layer 46a of Al. Conductor plugs 44b of W or Al are buried in the openings 48.

A conductor layer 46b of Al is formed on the inter-layer insulation film 24b with the conductor plugs 44b buried in.

Openings 50 are formed in the inter-layer insulation film 24c down to the conductor layer 46b of Al. Conductor plugs 44c of W or Al are buried in the openings 50.

A conductor layer 46c of Al is formed on the inter-layer insulation film 24c with the conductor plugs 44c buried in.

Openings 52 are formed in the inter-layer insulation film 24d down to the conductor layer 24d of Al. Conductor plugs 44d of W or Al are formed in the openings 52.

A conductor layer 46d of Al are formed on the inter-layer insulation film 36 with the conductor plugs 44d buried in.

As described above, the conductor layers 46a to 46d and the conductor plugs 44a to 44d function as heat conducting means for conducting heat to the substitutable layer 14 and the interconnection layer 20.

Thus, the semiconductor device according to the present embodiment is constituted.

Next, the method for writing information into the anti-fuse according to the present embodiment will be explained.

Polysilicon forming the substitutable layer 14 is very resistive as described above, and the anti-fuse 23 is in the non-conduction state in the state where the substitutable layer 14 of polysilicon is not replaced by aluminum.

When the anti-fuse 23 is changed to the conduction state, laser beams are applied to the conductor layer 46d from the upper side. The conductor layer 46d is thus heated, and the heat is conducted to the substitutable layer 14 and the interconnection layer 20 via the conductor plugs 44a to 44d and the conductor layers 46a to 46c. At this time, an intensity of the laser beams to be applied to the conductor layer 46d is suitably set so that a temperature of the substitutable layer 14 and the interconnection layer 20 becomes 300° C. to 600° C. Thus, silicon of the substitutable layer 14 of plolysilicon and aluminum of the interconnection layer 20 are mutually diffused to substitute the substitutable layer 14 of polysilicon with aluminum. The metal substituted layer formed by substituting the substitutable layer 14 with aluminum has low electric resistances, whereby the anti-fuse 23 has the conduction state.

Thus, the anti-fuse 23 is changed from the non-conduction state to the conduction state to thereby replace defective element s by normal elements. The semiconductor device can have high yields.

Figure 6:
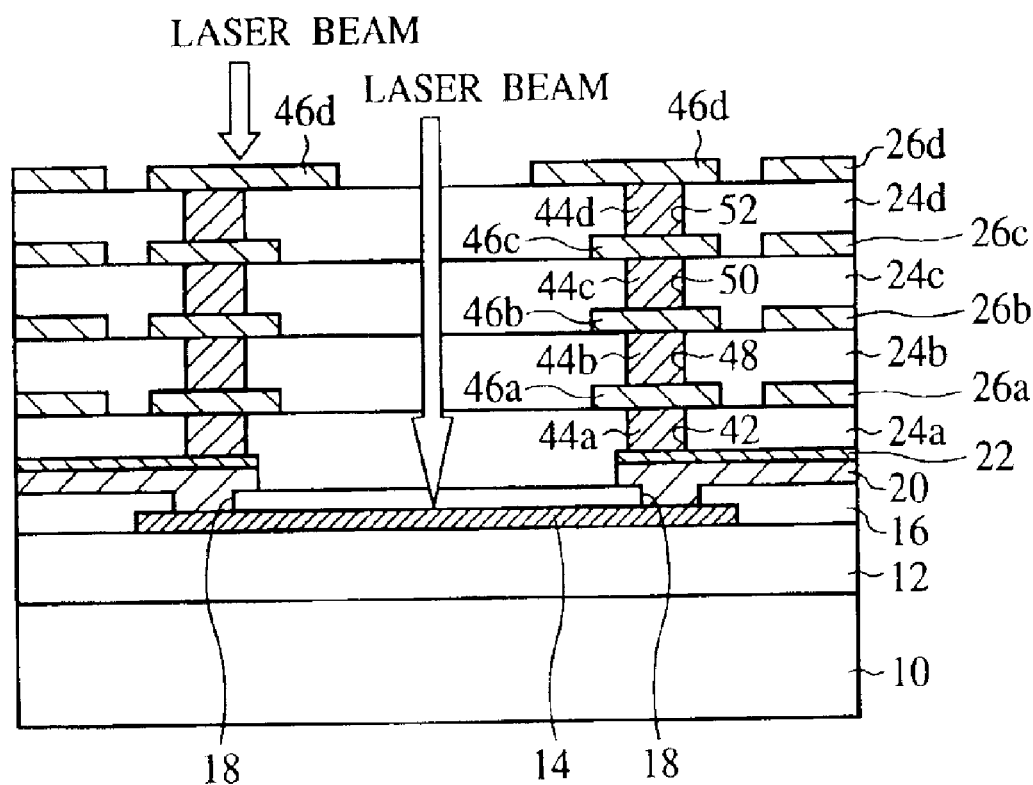
FIG. 6 is a sectional view of the semiconductor device according to the second embodiment of the present invention, which shows the application laser beams to both the conductor layer and the interconnection layer.

The present embodiment has been explained above by means of the example that laser beams are applied only to the conductor layer 46d to conduct heat to the substitutable layer 14 and the interconnection layer 20 to thereby replace the substitutable layer 14 of polysilicon with aluminum. However, as shown in FIG. 6, laser beams may be applied to both the conductor layer 46d and the substitutable layer 14. FIG. 6 is a sectional view of the semiconductor device, which shows the application of laser beams to both the conductor layer and the interconnection layer. The application of laser beams to both the conductor layer 46 and the substitutable layer 14 can heat the substitutable layer 14 and the interconnection layer 20 in a shorter period of time.

Laser beams may be applied to at least one of the substitutable layer 14 and the conductor layer 46d. This is because laser beams are applied to at least one of the substitutable layer 14 and the conductor layer 46d, whereby both the substitutable layer 14 and the interconnection layer 20 can be heated to thereby substitute the substitutable layer 14 of polysilicon with aluminum. According to the present embodiment, laser beams may be applied to one of the conductor layer 46d and the substitutable layer 14, and even when an equipment which cannot apply laser beams with high accuracy, the anti-fuse 23 can be changed from the non-conduction state to the conduction state.

The semiconductor device according to the present embodiment is characterized mainly in that, as described above, the conductor layers 46a to 46d and the conductor plugs 44a to 44d for conducting heat to the substitutable layer 14 and the interconnection layer 20 from the surface of the inter-layer insulation film 24d are buried in the inter-layer insulation films 24a to 24d.

In the semiconductor device according to the first embodiment shown in FIG. 1, considerably intense laser beams must be applied in account of attenuation of the laser beams in the inter-layer insulation films 24a to 24d.

In contrast to this, according to the present embodiment, the conductor layers 46a to 46d and the conductor plugs 44a to 44d for conducting heat to the substitutable layer 14 and the interconnection layer 20 from the surface of the inter-layer insulation film 24d are buried in the inter-layer insulation films 24a to 24d, whereby even when relatively weak laser beams are applied, the substitutable layer 14 of polysilicon can be substituted with aluminum. Thus, according to the present embodiment, the anti-fuse 23 can be changed from the non-conduction state to the conduction state by using a more inexpensive equipment.

The present embodiment has been explained by means of the example that laser beams are applied only to the conductor layer 46d to conduct the heat to the substitutable layer 14 and the interconnection layer 20, whereby the substitutable layer 14 of polysilicon is substituted by aluminum, but laser beams maybe applied to both the conductor layer 46d and the substitutable layer 14. This is because laser beams are applied to both the conductor layer 46d and the substitutable layer 14, whereby the substitutable layer 14 and the interconnection layer 20 can be heated in a shorter period of time.

Laser beams may be applied to at least one of the substitutable layer 14 and the conductor layer 46d. This is because the application of laser beams at lest one of the substitutable layer 14 and the conductor layer 46d can heat the substitutable layer 14 and the interconnection layer 20, whereby the substitutable layer 14 of polysilicon can be substituted with aluminum. According to the present embodiment, laser beams may be applied to one of the conductor layer 46d and the substitutable layer 14, whereby even with an equipment which cannot apply laser beams with high accuracy, the anti-fuse 23 can be changed from the non-conduction state to the conduction state.

(The Method for Fabricating the Semiconductor Device)

Next, the method for fabricating the semiconductor device according to the present embodiment will be explained with reference to FIGS. 7A to 7D. FIGS. 7A to 7D are sectional views of the semiconductor device according to the present embodiment in the steps of the method for fabricating the same, which show the method.

Figure 7A:
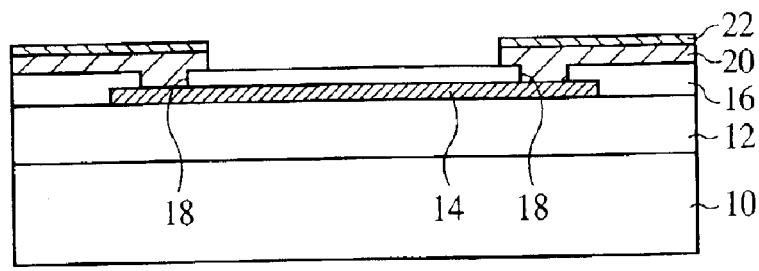
FIGS. 7A to 7D are sectional views of the semiconductor device according to the second embodiment of the present invention in the steps of the method for fabricating the same, which show the method.
Figure 7B:
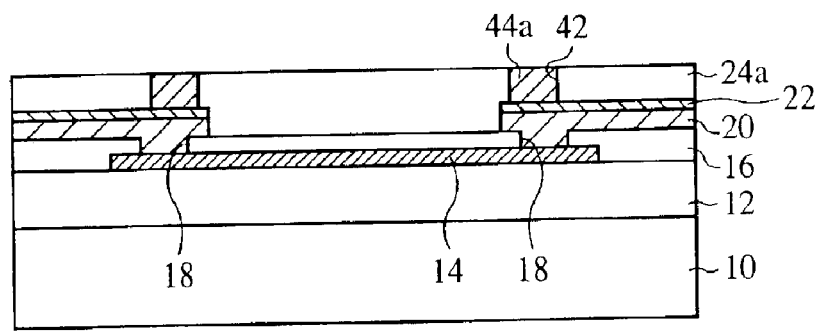

The steps up to the step of forming the interconnection layer 20 with the absorption layer 22 formed on the upper surface including the interconnection layer 20 forming step are the same as those of the method for fabricating the semiconductor device according to the first embodiment shown in FIGS. 2A to 2D, and their explanation will not be repeated (FIG. 7A).

Next, the inter-layer insulation film 24a is formed as shown in FIG. 7A in the same way as described above with reference to FIG. 3A.

The openings 42 are formed in the inter-layer insulation film 24a down to the interconnection layer 20 of Al with the absorption layer 22 formed on the upper surface.

The conductor plugs 44a of W or Al are buried in the openings 42.

Figure 7C:
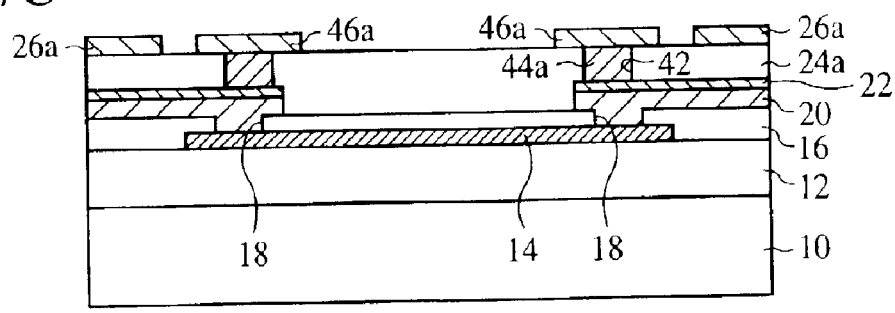

Next, as shown in FIG. 7C, the interconnection layer 26a of Al and the conductor layer 46a are formed on the inter-layer insulation film 24a with the conductor plugs 44a buried in. At this time, the conductor layer 46a is formed, connected to the conductor plugs 44a.

Figure 7D:
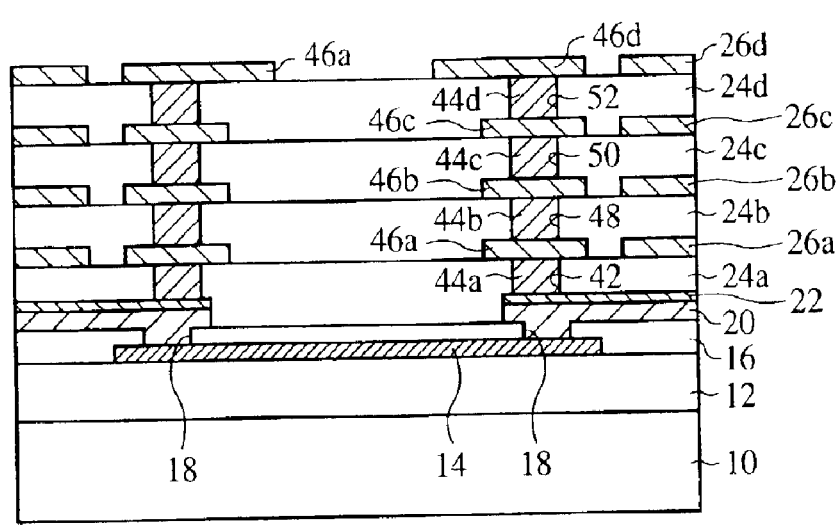

Next, as shown in FIG. 7D, the inter-layer insulation film 24b is formed on the inter-layer insulation film 24a with the interconnection layer 26a and the conductor layer 46a formed on.

Then, the openings 48 are formed in the inter-layer insulation film 24b down to the conductor layer 46a.

Next, the conductor plugs 44b of W or Al are buried in the openings 48.

Then, the interconnection layer 26b of Al and the conductor layer 46b are formed on the inter-connection insulation film 24b with the conductor plugs 44b buried in. At this time, the conductor layer 46b is formed, connected to the conductor plugs 44b.

Next, the inter-layer insulation film 24c is formed on the inter-layer insulation film 24b with the interconnection layer 26b and the conduction layer 46b formed on.

Then, the openings 50 are formed in the inter-layer insulation film 24c down to the conductor layer 46b.

Next, the conductor plugs 44c of W or Al are buried in the openings 50.

Then, the interconnection layer 26c of Al and the conductor layer 46c are formed on the inter-layer insulation film 24c with the conductor plugs 44c buried in. At this time, the conductor layer 46c is formed, connected to the conductor plugs 44c.

Then, the inter-layer insulation film 24d is formed on the inter-layer insulation film 24c with the interconnection layer 26c and the conductor layer 46c formed on.

Next, the openings 52 are formed in the inter-layer insulation film 24d down to the conductor layer 46c.

Then, the conductor plugs 44d of W or Al are buried in the openings 52.

Next, the interconnection layer 26d of Al and the conductor layer 46d are formed on the inter-layer insulation film 24d with the conductor plugs 44d buried in. At this time, the conductor layer 46d is formed, connected to the conductor plugs 44d.

Thus, the semiconductor device according to the present embodiment is fabricated.

(Modification)

Figure 8:
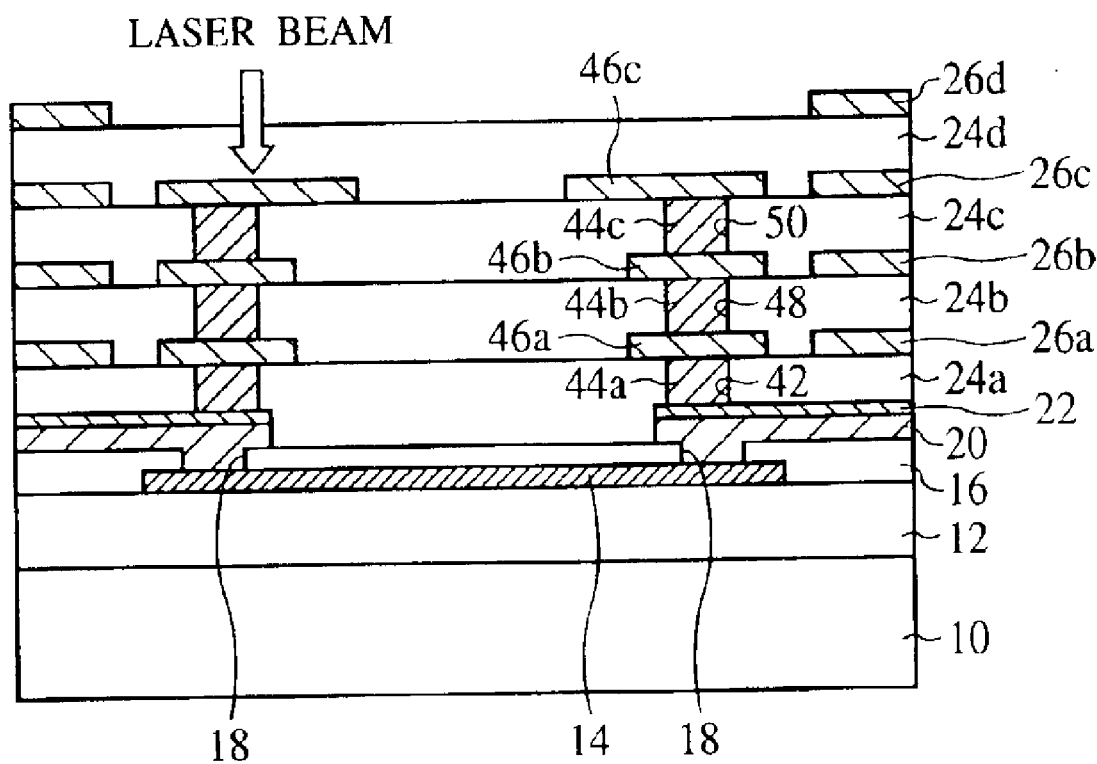
FIG. 8 is a sectional view of the semiconductor device according to one modification of the second embodiment of the present invention.

Next, the semiconductor device according to a modification of the present embodiment will be explained with reference to FIG. 8. FIG. 8 is a sectional view of the semiconductor device according to the present modification.

The semiconductor device according to the present modification is characterized mainly in that the upper most conductor layer is not exposed on the uppermost inter-layer insulation film, but the conductor layers and the conductor plugs are laid up to the vicinity of the uppermost layer.

In the semiconductor device shown in FIG. 6 the uppermost conductor layer 46d is exposed on the uppermost inter-layer insulation film 24d, but in the present modification, the conductor plugs 44d and the conductor layer 46d shown in FIG. 6 are not formed. In the present modification, the uppermost conductor layer 46c is not exposed on the inter-layer insulation film 24d. However, because of a relatively small thickness of the inter-layer insulation film 24d present on the uppermost layer 46c, attenuation of laser beams in the inter-layer insulation film 24d is small. That is, in the present embodiment, the conductor layers 46a to 46c and the conductor plugs 44a to 44c are laid up to the vicinity of the uppermost layer of the inter-layer insulation films 24a to 24d, whereby attenuation of laser beams in the inter-layer insulation film s 24a to 24d is small. Accordingly, in the present modification as well, heat can be conducted to the substitutable layer 14 via the conductor layers 46a to 46c and the conductor plugs 44a to 44c.

Thus, the uppermost conductor layer 46c may not be exposed on the uppermost inter-layer insulation film 24d.

A Third Embodiment

Figure 9:
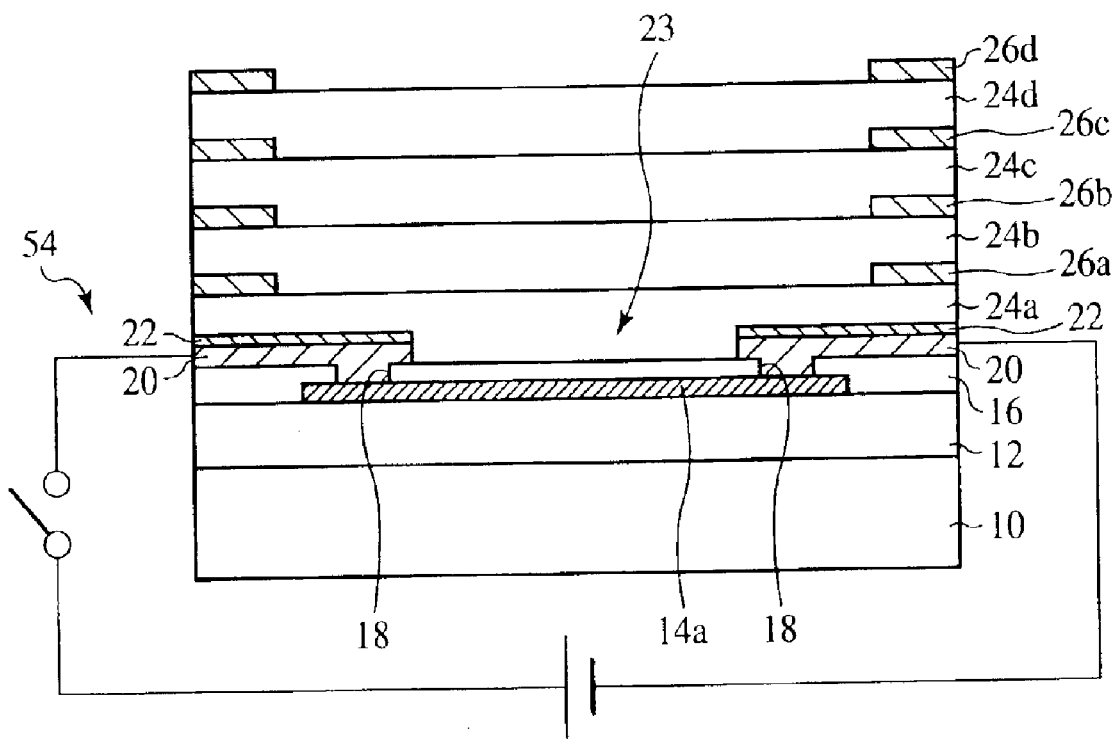
FIG. 9 is a diagrammatic view of the semiconductor device according to a third embodiment of the present invention.

The semiconductor device according to a third embodiment of the present invention and the method for writing information into the anti-fuse will be explained with reference to FIG. 9. FIG. 9 is a diagrammatic view of the semiconductor. The same members of the present embodiment as those of the semiconductor device according to the first or the second embodiment and the method for fabricating the same are represented by the same are represented by the same reference numbers not to repeat or to simplify their explanation.

The semiconductor according to the present embodiment is characterized mainly by a current supply circuit 54 for supply current to a substitutable layer 14a and an interconnection layer 20.

As shown in FIG. 9, the substitutable layer 14a of polysilicon is formed on an insulation film 12. An electric resistance of the substitutable layer 14a is, e.g., 1 to 10 Ω. An electric resistance of the substitutable layer 14a can be set at such value by implanting a suitable dopant in the polysilicon.

The interconnection layer 20 of Al is connected to both ends of the substitutable layer 14a of polysilicon, as in the first and the second embodiments.

The current supply circuit 54 for flowing current to the substitutable layer 14a to heat of itself is connected to both ends of the interconnection layer 20.

Next, the method for writing information into the anti-fuse will be explained.

As described above, the substitutable layer 14a of polysilicon is so resistive that the substitutable layer 14a of polysilicon which has not been substituted with aluminum has the non-conduction state.

When the anti-fuse 23 is made conductive, current is supplied from the current supply circuit 54 to the substitutable layer 14a and the interconnection layer 20 to cause the substitutable layer 14a to heat of itself. At this time, the current supply to the substitute layer 14a and the interconnection layer 20 is suitably set so that a temperature of the substitutable layer 14a and the interconnection layer 20 is about 300° C. to 600° C. A calorie of the substitutable layer 14a is proportional to a square of the current flowing through the substitutable layer 14a and is proportional to an electric resistivity of the substitutable layer 14a. When the substitutable layer 14a and the interconnection layer 20 are heated to about 300° C. to 600° C., the polysilicon-aluminum substitution advances from both sides of the substitutable layer 14a. When finally all the substitutable layer 14a is all substituted with aluminum, the electric resistance of the substitutable layer 14a becomes lower, and the calorie gradually decreases, and temperatures of the substitutable layer 14a and the interconnection layer 20 gradually lower. The metal substituted layer which is the substitutable layer 14a substituted with aluminum has very low electric resistance, and the anti-fuse 23 has the conduction state.

Figure 10:
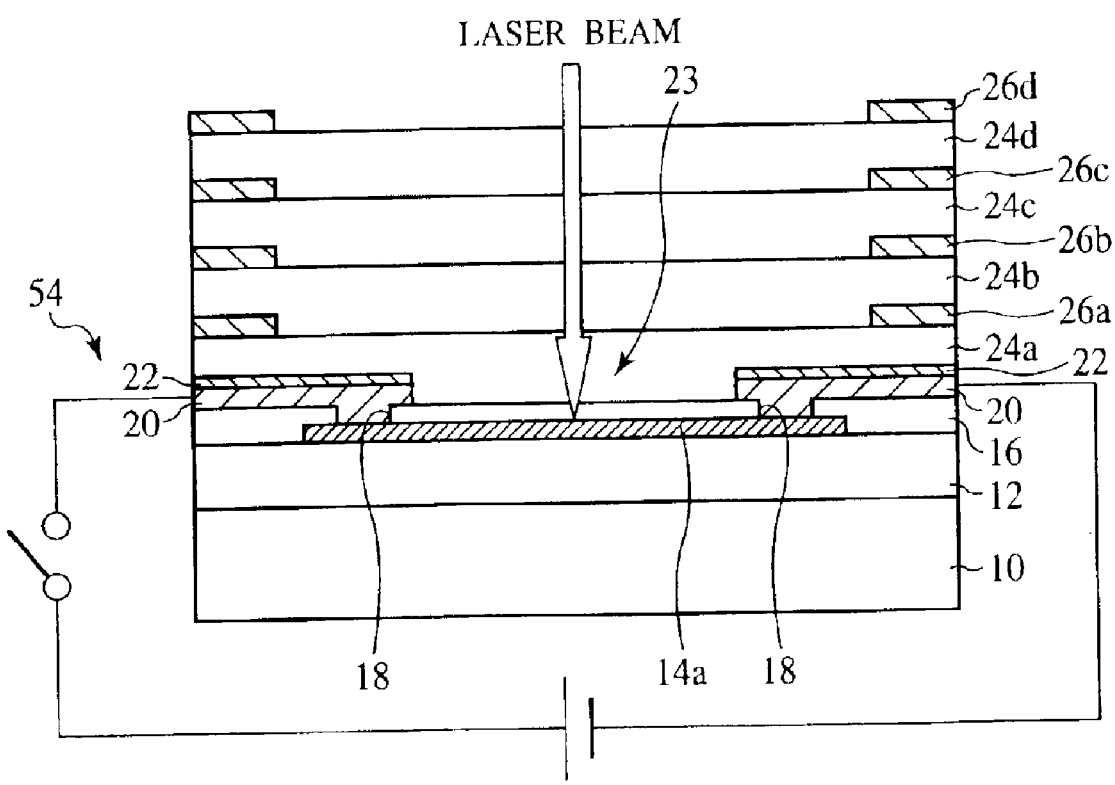
FIG. 10 is a diagrammatic view of the semiconductor device according to the third embodiment of the present invention, which shows changing the anti-fuse from the non-conduction state to the conduction state by application of laser beams.

Thus, the anti-fuse 23 is changed from the non-conduction state to the conduction state, and defective elements are replaced by normal elements. Thus, the semiconductor device can have high yields In the above, current is supplied to the substitutable layer 14a and the interconnection layer 20 to cause the substitutable layer 14a heat by itself to thereby substitute the substitutable layer 14a of polysilicon with aluminum. However, as shown in FIG. 10, laser beams are applied to thereby substitute the substitutable layer 14a of polysilicon with aluminum. FIG. 10 is a diagrammatic view of changing the anti-fuse from the non-conduction state to the conduction state by applying laser beams. That is, in the semiconductor device, the anti-fuse 23 can be changed from the non-conduction sate to the conduction state by supplying current to the substitutable layer 14a and the interconnection layer 20 or by applying laser beams to the substitutable layer 14a.

Because an electric resistance of the substitutable layer 14a is proportional to a length of the substitutable layer 14a, the electric resistance of the substitutable layer 14a gradually decreases as the substitutable layer 14a of polysilicon is gradually replaced by aluminum. As the electric resistance of the substitutable layer 14a gradually decreases, current flowing through the substitutable layer 14a and the interconnection layer 20 gradually increases, and there is a risk that excessive current may flow. To prevent the flow of the excessive current through the substitutable layer 14a and the interconnection layer 20, it is preferable that a breaking circuit (not shown) for preventing the flow of current of above a prescribed value is added.

The semiconductor device according to the present embodiment is characterized, as described above, mainly by the current supply circuit 54 for supplying current to the substitutable layer 14a and the interconnection layer 20.

In the semiconductor device according to the first and the second embodiments, laser beams are applied to heat the substitutable layer 14a and the interconnection layer 20, whereby the substitutable layer 14a of polysilicon is substituted with aluminum.

In the present embodiment, however, with the current supply circuit 54 for supplying current to the substitutable layer 14a and the interconnection layer 20, the substitutable layer 14a and the interconnection layer 20 can be heated without applying laser beams. Thus, according to the present embodiment, the anti-fuse 23 can be changed from the non-conduction sate to the conduction state without applying laser beams.

According to the present embodiment, the anti-fuse 23 can be changed from the non-conduction state to the conduction state also by supplying current to the substitutable layer 14a and the interconnection layer 20 and also by applying laser beams directly to the substitutable layer 14a. Thus, according to the present embodiment, for example, before semiconductor chips are sealed in a package, laser beams are applied to change the anti-fuses 23 from the non-conduction state to the conduction state, and after the semiconductor chips have been sealed in the package, the substitutable layer 14a heats by itself by the use of the current supply circuit 54 to thereby change the anti-fuses 23 from the non-conduction sate to the conduction state. That is, according to the present embodiment, before semiconductor chips are sealed in packages, the anti-fuses 23 are used as laser anti-fuses, and the anti-fuses 23 anti-fuses are used as electronic fuses after the semiconductor chips have been sealed in the packages. According to the present embodiment, the anti-fuses 23 are used as not only laser anti-fuses but also as electronic anti-fuses, whereby it is not necessary to respectively form the laser anti-fuses and the electronic anti-fuses. Accordingly, the present embodiment can realize the simple structure and the simple fabrication process.

A Fourth Embodiment

Figure 11A:
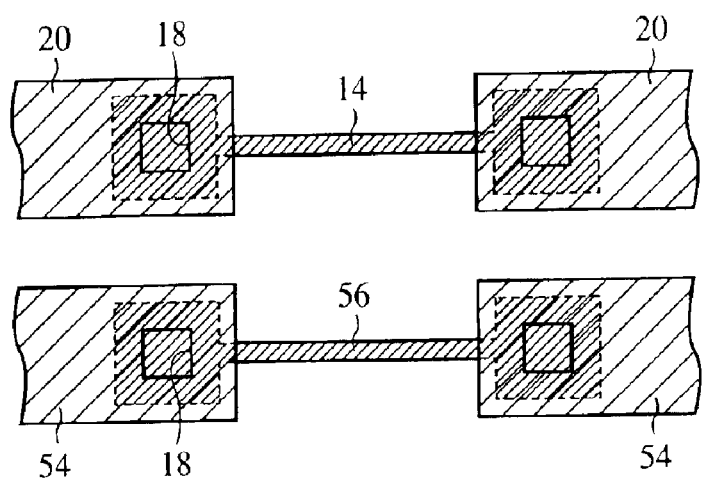
FIGS. 11A to 11C are diagrammatic views of the semiconductor device according to a fourth embodiment of the present invention.
Figure 11B:
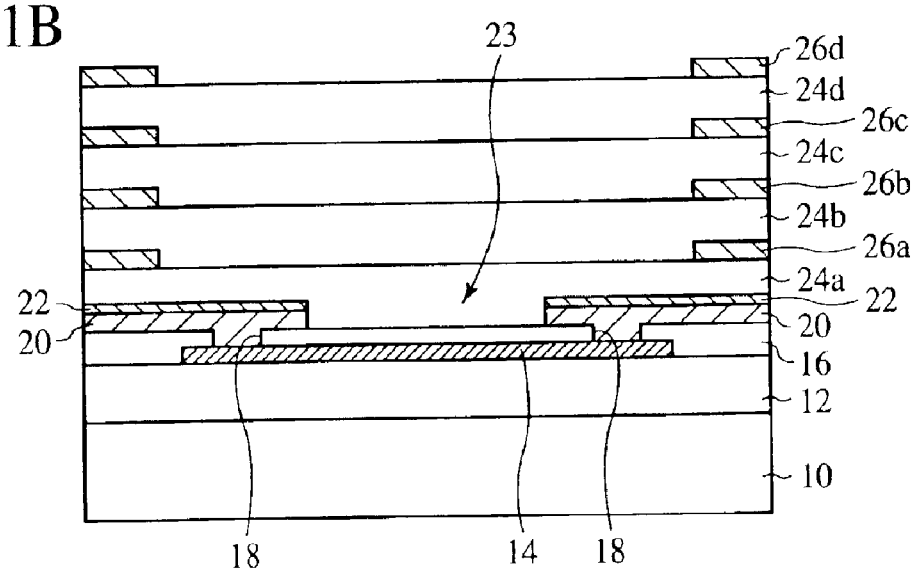
Figure 11C:
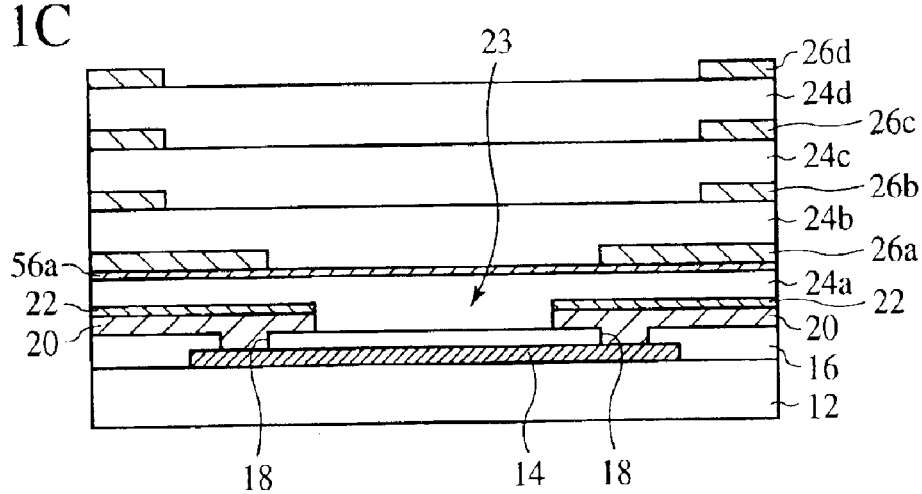

The semiconductor device according to the present embodiment and the method for writing information into an anti-fuse will be explained with reference to FIGS. 11A to 11C. FIGS. 11A to 11C are diagrammatic views of the semiconductor device according to the present embodiment. FIG. 11A is an upper view. FIG. 11B is a sectional view. The same members of the present embodiment as those of the semiconductor device according to the first to the third embodiments and the method for fabricating the same are represented by the same reference numbers not to repeat or to simplify their explanation.

The semiconductor device according to the present embodiment is characterized mainly in that a resistor 56 as heating means for heating a substitutable layer 14 and an interconnection layer 20 is provided near the substitutable layer 14.

As shown in FIGS. 11A to 11C, the resistor 56 is disposed near the substitutable layer 14 of polysilicon. The resistor 56 is for heating the substitutable layer 14 and the interconnection layer 20.

The resistor 56 is connected to a current supply circuit 54. The current supply circuit 54 supplies current to the resistor 56 to cause the resistor 56 to heat by itself so as to heat the substitutable layer 14.

Thus, the semiconductor device according to the present embodiment is constituted.

Next, the method for writing information into an anti-fuse will be explained.

As described, polysilicon forming the substitutable layer 14 is highly resistive. The anti-fuse 23 is in the non-conduction state in the state that the substitutable layer 14 of polysilicon is not substituted with aluminum.

When the anti-fuse 23 is made conductive, current is supplied to the resistor 56 from the current supply circuit 54 to cause the resistor 56 to heat by itself. At this time, the current to be supplied to the resistor 56 is suitably set so that a temperature of the substitutable layer 14 and the interconnection layer 20 is 300° C. to 600° C. Thus, silicon of the substitutable layer 14 of polysilicon and aluminum of the interconnection layer 20 are mutually diffused to substitute the substitutable layer 14 of polysilicon with aluminum. The metal substituted layer 14 which is the substitutable layer 14 substituted with aluminum has a very low electric resistance, and the anti-fuse 23 has the conduction state.

Thus, the anti-fuse 23 is changed from the non-conduction state to the conduction state, and defective elements are replaced by normal elements. Accordingly, the semiconductor device can have high yields.

The semiconductor device according to the present embodiment is characterized mainly in that, as described above, the resistor 56 for heating the substitutable layer 14 is disposed near the substitutable layer 14.

In the semiconductor device according to the third embodiment, current is flowed through the substitutable layer 14 to cause the substitutable layer 14 to heat by itself, whereby the substitutable layer 14 of polysilicon is substituted with aluminum. However, in the present embodiment, the substitutable layer 14 and the interconnection layer 20 are heated by the resistor 56 provided separately from the substitutable layer 14.

Thus, the resistor 56 for heating the substitutable layer 14 may be disposed near the substitutable layer 14.

In the above, the resistor 56 is formed on the same layer as the substitutable layer 14, but the resistor may be formed above or below the substitutable layer.

FIG. 11C is a view of the case that the resistor as the heating means is formed above the substitutable layer.

As shown in FIG. 11C, the resistor 56a of TiN is formed on the inter-layer insulation film 24a.

An interconnection layer 26a of Al is formed on the resistor 56a. The interconnection layer 26a is not formed above the substitutable layer 14. That is, the interconnection layer 26a is connected to both ends of the resistor 56.

The resistor 56a is connected to the current supply circuit (not shown) via the interconnection layer 26a.

The electric resistance of TiN forming the resistor 56a is higher than that of Al forming the interconnection layer 26a. When current is supplied to the resistor 56a, the resistor 56a is cause to heat by itself to thereby heat the substitutable layer 14.

The resistor 56a maybe thus formed above the substitutable layer 14.

In the semiconductor device shown in FIG. 11C, it is possible that a layer film is formed of a TiN layer and an Al layer, and the Al layer in an upper region of the substitutable layer 14 is removed.

Figure 12:
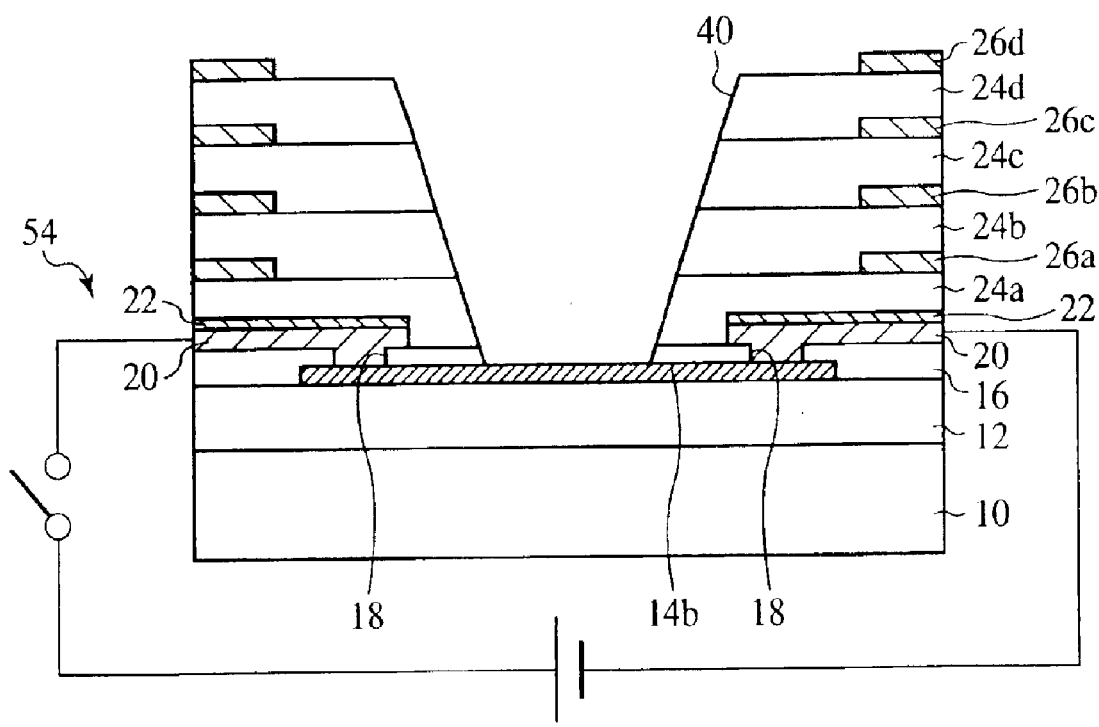
FIG. 12 is a diagrammatic view of the semiconductor device according to a fifth embodiment of the present invention.
Figure 13:
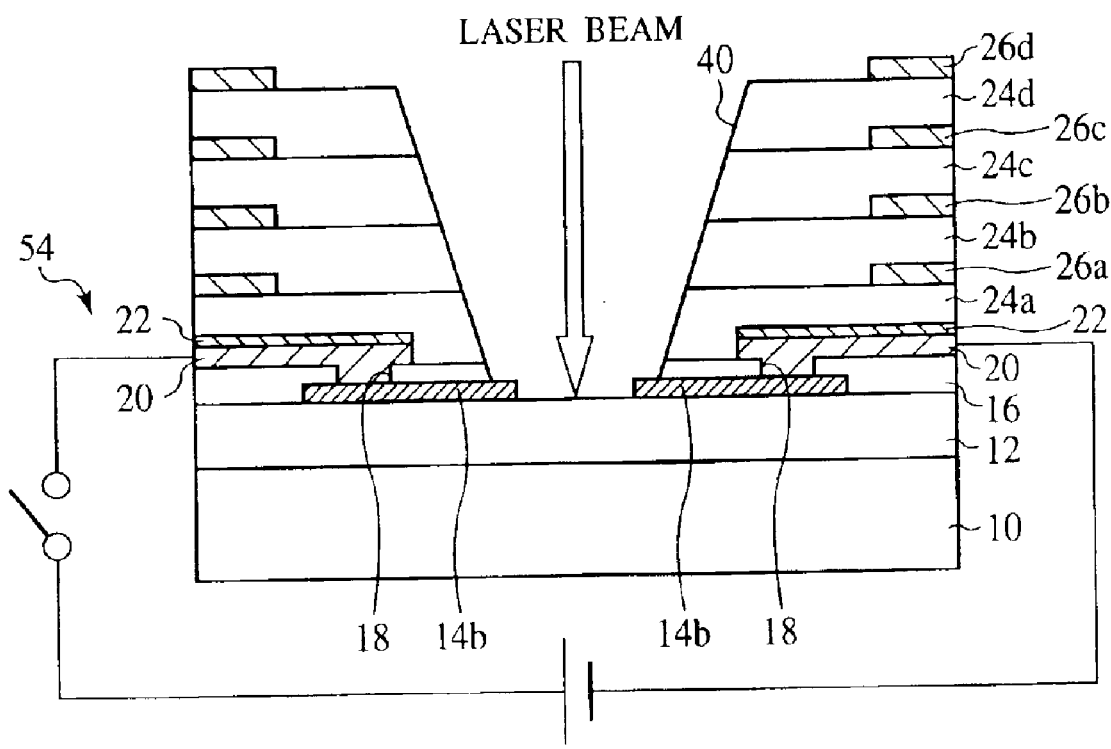
FIG. 13 is a diagrammatic view of the semiconductor device according to the fifth embodiment of the present invention, which shows the state in which the interconnection layer is broken.

The semiconductor device according to a fifth embodiment of the present invention and the method for writing information into an anti-fuse will be explained with reference to FIGS. 12 and 13. FIG. 12 is a diagrammatic view of the semiconductor device according to the present embodiment. FIG. 13 is a diagrammatic view of the state where an interconnection layer is broken. The same members of the present embodiment as those of the semiconductor device according to the first to the fourth embodiments and the method for fabricating the same shown in FIGS. 1 to 11C are represented by the same reference numbers not to repeat or to simplify their explanation.

The semiconductor device according to the present embodiment is characterized mainly in that the anti-fuse can be used also as a fuse.

As shown in FIG. 12, an opening 40 is formed in inter-layer insulation films 24a to 24d and an insulation film 16 down to the substitutable layer 14b. The opening 40 secures a passage for melted metal substituted layer to evaporate when laser beams are applied to the metal substituted layer which is the substitutable layer 14 substituted with aluminum.

The substitutable layer 14b of polysilicon is very micronized in, e.g., a 0.2 $\mu$m-width and a 50 to 200 nm-thickness. The substitutable layer 14b, which is very micronized, facilitates cutting off the metal substituted layer which is the metal substituted layer 14b substituted with aluminum.

Thus, the semiconductor device according to the present embodiment is constituted.

Then, the method for writing information into the anti-fuse will be explained.

The anti-fuse of the semiconductor device according to the present embodiment can be changed from the non-conduction state to the conduction state by the substitutable layer 14b of aluminum is substituted with aluminum, as in the anti-fuse of the semiconductor device according to the third embodiment.

In the semiconductor device according to the present embodiment, the anti-fuse 23 can be changed from the conduction state to the non-conduction sate as follows. That is, when the anti-fuse 23 is changed from the conduction state to the non-conduction state, laser beams are applied to the substitute layer 14b. Thus, at least a part of the substitutable layer 14b is melted and evaporated to thereby place the substitutable layer 14b in the broken state. Thus, the anti-fuse 23 is changed form the conduction state to the non-conduction state.

In the present embodiment, laser beams are applied to the substitutable layer 14b to thereby break the substitutable layer 14b. However, the substitutable layer 14b may be broken by supplying large current to the substitutable layer 14b by a current supply circuit 54. That is, the anti-fuse 23 can be changed from the conduction state to the non-conduction state by flowing large current to the substitutable layer 14b without using laser beams.

As described above, according to the present embodiment, the anti-fuse which has been changed from the non-conduction state to the conduction state can be changed from the conduction state to the non-conduction state. That is, according to the present embodiment, the anti-fuse can be used as the fuse.

According to the present embodiment, the anti-fuse can be changed from the non-conduction state to the conduction state and then from the conduction state to the non-conduction state, whereby the anti-fuse which has been erroneously changed to the conduction state can be returned to the non-conduction state.

[Modifications]

The present invention is not limited to the above-described embodiments and can cover other various modifications.

For example, in the above-described embodiments, the substitutable layer 14 is formed of polysilicon, but a crystal state of the substitutable layer 14 is not essentially limited to the polycrystal state and can be, e.g., amorphous or the single crystal state.

In the above-described embodiments, the interconnection layer 20 is formed of Al. However, a material of the interconnection layer 20 is not essentially limited to Al, and a metal which is substitutive with atoms forming the substitutable layer 14 can be suitably used. For example, as a material of the interconnection layer 20, Cu, Au, Pt, Ag, Ru or others can be used.

In the above-described embodiments, the substitutable layer 14 is formed of silicon. However, a material of the substitutable layer 14 is not limited to silicon, and SiGe, Ge or others, for example, may be used.

In the above described embodiments, the substitutable layer 14 is formed of a semiconductor. However, a material of the substitutable layer 14 is not limited to a semiconductor and can be a material which can be substituted with a metal.

In the above-described embodiments, the absorption layer 22 is formed of Ti. However, a material of the absorption layer is not limited to Ti and can be a material, e.g., Co, Ni or others, which can absorb silicon.

In the above-described embodiment, the absorption layer 22 is formed but is not essentially formed. The interconnection layer 20 is formed thick, whereby polysilicon can be substituted with aluminum without the absorption layer 22.

In the semiconductor device according to the fourth or the fifth embodiment, a trigger circuit for turning on/off the current to be supplied from the current supply circuit may be added. It is preferable that the trigger circuit can receive trigger signals from the outside of a package.

In the above-described embodiments, the interconnection layer 20 is formed on the substitutable layer 14 but is not essentially formed on the interconnection layer 20. As long as the substitutable layer 14 of polysilicon and the interconnection layer 20 of aluminum are in contact with each other, the substitutable layer 14 of polysilicon can be substituted with aluminum.

In the second embodiment, the conductor layers 46a to 46d and the conductor plugs 44a to 44b are in contact with the interconnection layer 20 but are not essentially in contact with the interconnection layer 20. That is, the conductor layers 46a to 46d and the conductor plugs 44a to 44b may be formed so that heat can be conducted to at least one of the substitutable layer 14 and the interconnection layer 20. For example, the substitutable layer 14 may be connected to the conductor layers 46a to 46d and the conductor plugs 44a to 44b.

In the above-described embodiments, the anti-fuse is mounted the on semiconductor device. The above-described anti-fuse can be mounted not only on semiconductor device but also on all electronic devices.

In the above-described embodiments, the anti-fuse is mounted on the semiconductor device, but the present invention is applicable to a single anti-fuse.

What is claimed is:

1. An anti-fuse comprising:
   a substitutable layer;
   the anti-fuse also comprising an interconnection layer connected to one end portion of the substitutable layer; and
   another interconnection layer connected to the other end portion of the substitutable layer,
   the interconnection layer containing metal atoms of one of Al, Cu, Au Ag and Ru which can be substituted with constituent atoms of the substitutable layer.

2. An anti-fuse according to claim 1, wherein a conductor which conducts heat to at least one of the substitutable layer and the interconnection layer is buried in an insulation film formed above the substitutable layer.

3. An anti-fuse according to claim 1, further comprising a current supply circuit for supplying current to at least the substitutable layer.

4. An anti-fuse according to claim 1, further comprising heating means for heating at least one of the substitutable layer and the interconnection layer.

5. An anti-fuse according to claim 1, wherein the interconnection layer is connected directly to the substitutable layer.

6. An anti-fuse according to claim 1, further comprising an absorption layer formed on the interconnection layer and absorbs the constituent atoms of the substitutable layer to be substituted by the metal atoms.

7. An anti-fuse according to claim 1, wherein the substitutable layer is formed of Si or SiGe.

8. An anti-fuse according to claim 1, wherein the constituent atoms of the substitutable layer are substituted with the metal atoms, and the substitutable layer is a metal substituted layer.

9. An anti-fuse according to claim 8, wherein the interconnection layer contains the constituent atoms of the substitutable layer.

10. An anti-fuse according to claim 8, wherein a concentration gradient of the constituent atoms of the substitutable layer is present in at least one of the metal substitutable layer and the interconnection layer.

11. An anti-fuse according to claim 8, wherein the metal substitutable layer and interconnection layer are integral with each other.

12. An anti-fuse according to claim 8, wherein a damages as a mark of applying laser beams to the upper surface of an insulation film formed on the metal substitutable layer.

13. An anti-fuse according to claim 8, wherein the metal substitutable layer is cut off.

14. An electronic device comprising an anti-fuse according to claim 1.

15. A method for writing information into an anti-fuse comprising a substitutable layer; an interconnection layer connected to one end of portion of the substitutable layer; and another interconnection layer connected to the other end portion of the substitutable layer,
   the interconnection layer containing metal atoms of one of Al, Cu, Au Ag and Ru which can be substituted with constituent atoms of the substitutable layer; and
   the metal atoms of the interconnection layer being substituted with the constituent atoms of the substitutable layer to thereby change the anti-fuse from the non-conduction state to the conduction state.

16. A method for writing information into an anti-fuse according to claim 15, wherein laser beams are applied to at least one of the substitutable layer and the interconnection layer to thereby substitute the constituent atoms of the substitutable layer with the metal atoms of the interconnection layer.

17. A method for writing information into an anti-fuse according to claim 15, wherein
   a conductor for conducting heat to at least one of the substitutable layer and the interconnection layer is buried in an insulation film formed above the substitutable layer; and
   laser beams are applied to the conductor to thereby substitute the constituent atoms of the substitutable layer with the metal atoms of the interconnection layer.

18. A method for writing information into an anti-fuse according to claim 15, wherein current is supplied to the substitutable layer to thereby cause the substitutable layer to heat to thereby substitute the constituent atoms of the substitutable layer with the metal atoms of the interconnection layer.

19. A method for writing information into an anti-fuse according to claim 15, wherein
   heating means for heating at least one of the substitutable layer and the interconnection layer is provided; and at least one of the substitutable layer and the interconnection layer is heated by the heating means to thereby substitute the constituent atoms of the substitutable layer with the metal atoms of the interconnection layer.

20. An anti-fuse comprising:

a substitutable layer; and an interconnection layer connected to the substitutable layer, the interconnection layer containing metal atoms which can be substituted with constituent atoms of the substitutable layer, wherein the anti-fuse further comprises an absorption layer formed on the interconnection layer and absorbs the constituent atoms of the substitutable layer to be substituted by the metal atoms.

21. An anti-fuse comprising:

a substitutable layer formed over a substrate; and the anti-fuse also comprising an interconnection layer connected to the substitutable layer, the interconnection layer containing metal atoms of one of Al, Cu, Au, Ag and Ru which can be substituted with constituent atoms of the substitutable layer, the substitutable layer being provided in parallel with a surface of the substrate.

* * * * *